(12) United States Patent
Han

(10) Patent No.: US 8,228,409 B2
(45) Date of Patent: Jul. 24, 2012

(54) IMAGE SENSOR AND METHOD FOR MANUFACTURING THE SAME

(75) Inventor: Chang Hun Han, Gyeonggi-do (KR)

(73) Assignee: Dongbu Hitek Co., Ltd., Seoul (KR)

( * ) Notice: Subject to any disclaimer, the term of this patent is extended or adjusted under 35 U.S.C. 154(b) by 345 days.

(21) Appl. No.: 12/574,785

(22) Filed: Oct. 7, 2009

(65) Prior Publication Data

US 2010/0103298 A1   Apr. 29, 2010

(30) Foreign Application Priority Data

Oct. 24, 2008   (KR) .................. 10-2008-0104608
Oct. 24, 2008   (KR) .................. 10-2008-0104609

(51) Int. Cl.
*H04N 5/335*  (2006.01)
*H01L 21/00*  (2006.01)
*H01L 31/062*  (2012.01)

(52) U.S. Cl. ................. 348/294; 438/73; 257/291
(58) Field of Classification Search ............ 348/73, 348/294; 257/215, 291, 292; 438/73
See application file for complete search history.

(56) References Cited

U.S. PATENT DOCUMENTS

| | | | | |
|---|---|---|---|---|
| 6,018,187 A * | 1/2000 | Theil et al. | ................. | 257/458 |
| 6,252,218 B1 * | 6/2001 | Chou | ................. | 250/208.1 |
| 7,411,233 B2 * | 8/2008 | Chao et al. | ................. | 257/292 |
| 7,482,646 B2 * | 1/2009 | Gao et al. | ................. | 257/292 |
| 7,492,026 B2 * | 2/2009 | Thomas et al. | ................. | 257/444 |
| 7,713,766 B2 * | 5/2010 | Thomas et al. | ................. | 438/22 |
| 2008/0225752 A1 * | 9/2008 | Kwon et al. | ................. | 370/254 |

FOREIGN PATENT DOCUMENTS

| KR | 10-2005-0117674 A | 12/2005 |
|---|---|---|
| KR | 10-2006-0076071 A | 7/2006 |
| KR | 10-2010-0045609 A | 5/2010 |
| KR | 10-2010-0045610 A | 5/2010 |

* cited by examiner

*Primary Examiner* — Trung Diep
(74) *Attorney, Agent, or Firm* — Saliwanchik, Lloyd & Eisenschenk

(57) ABSTRACT

Disclosed are an image sensor and a method for manufacturing the same. The image sensor includes readout circuitry and an inter-layer dielectric layer on a first substrate, a metal line in the inter-layer dielectric layer and electrically connected with the readout circuitry, a plurality of contact plugs on the metal line, and an image sensing device on the contact plugs. The image sensing device is electrically connected to the metal line through the plurality of contact plugs. The method for manufacturing an image sensor includes forming a readout circuitry on a first substrate, forming an inter-layer dielectric layer on the first substrate, forming a metal line in the inter-layer dielectric layer such that the metal line is electrically connected with the readout circuitry, forming a plurality of contact plugs on the metal line per unit pixel, and forming an image sensing device on the plurality of contact plugs.

10 Claims, 5 Drawing Sheets

IMAGE SENSOR AND METHOD FOR MANUFACTURING THE SAME

CROSS-REFERENCE TO RELATED APPLICATIONS

This application claims the benefit under 35 U.S.C. §119 to Korean Patent Application Nos. 10-2008-0104608, filed on Oct. 24, 2008, and 10-2008-0104609, filed on Oct. 24, 2008, which are incorporated herein by reference in their entireties.

FIELD OF THE INVENTION

The present invention relates to an image sensor and a method for manufacturing the same.

BACKGROUND

Image sensors are semiconductor devices used to convert an optical image into an electrical signal, and are typically classified into a charge coupled device (CCD) image sensor and a CMOS image sensor (CIS).

According to the conventional technology, a photodiode (PD) is formed by implanting ions into a substrate. However, as the size of the PD is gradually decreased such that the number of pixels is increased without the increase of a chip size, an image quality may be degraded due to the area reduction of a light receiving part.

In addition, since a stack height has not decreased in a corresponding manner to the area reduction of the light receiving part, the number of photons input into the light receiving part may be decreased due to the diffraction of light called "Airy Disk".

As an alternative method to overcome the above problems, the PD may be deposited by using amorphous silicon (Si). In addition, after a readout circuitry is formed on a Si-substrate through a wafer-to-wafer bonding scheme, the PD may be formed on the readout circuitry (hereinafter, referred to as "three-dimensional image sensor"). In this case, the PD is connected with the readout circuitry through a metal line.

Meanwhile, according to the conventional technology, after two wafers are bonded to each other, signal lines must be formed on the wafer formed with the PD. To this end, after a contact is formed in a logic wafer, the logic wafer is bonded to the wafer formed with the PD. Then, silicon (Si) of the wafer formed with the PD is removed except for the PD area. In this case, high contact resistance may exert a bad influence upon the sensitivity of the image sensor. In other words, in the conventional structure, the sensitivity reduction of the image sensor is caused by high contact resistance.

According to the conventional technology, since a source and a drain of a transfer transistor are heavily doped with N-type dopants, charge sharing may occur. If the charge sharing occurs, the sensitivity for an output image is degraded, so that image errors may be caused.

According to the conventional technology, since photo-charges do not smoothly move between the photodiode and the readout circuit, dark current may occur, or saturation and sensitivity may be degraded.

BRIEF SUMMARY

Embodiments of an image sensor capable of reducing contact plug resistance for the photodiode, and a method for manufacturing the same are provided.

An embodiment provides an image sensor capable of inhibiting charge sharing while increasing a fill factor, and a method for manufacturing the same.

An embodiment provides an image sensor and a method for manufacturing the same, capable of minimizing dark current and inhibiting saturation and sensitivity of image from being degraded by forming a smooth moving path of photo charges.

According to an embodiment, an image sensor can include a readout circuitry formed on a first substrate, an inter-layer dielectric layer formed on the first substrate, a metal line formed in the inter-layer dielectric layer such that the metal line is electrically connected with the readout circuitry, a plurality of contact plugs formed on the metal line, and an image sensing device formed on the plurality of contact plugs. The image sensing device is electrically connected to the metal line through the plurality of contact plugs.

According to an embodiment, a method for manufacturing an image sensor can include forming a readout circuitry on a first substrate, forming an inter-layer dielectric layer on the first substrate, forming a metal line in the inter-layer dielectric layer such that the metal line is electrically connected with the readout circuitry, forming a plurality of contact plugs on the metal line per unit pixel, and forming an image sensing device on the contact plugs.

DETAILED DESCRIPTION

An image sensor and a method for manufacturing the same according to embodiments will be described in detail with reference to accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, or one or more intervening layers may also be present. In addition, it will also be understood that when a layer is referred to as being 'between' two layers, it can be the only layer between the two layers, or one or more intervening layers may also be present.

It should be noted that the present invention is not limited to a CMOS image sensor. Embodiments of the present invention are applicable to any image sensor requiring a photo-diode.

First Embodiment

Figure 1:
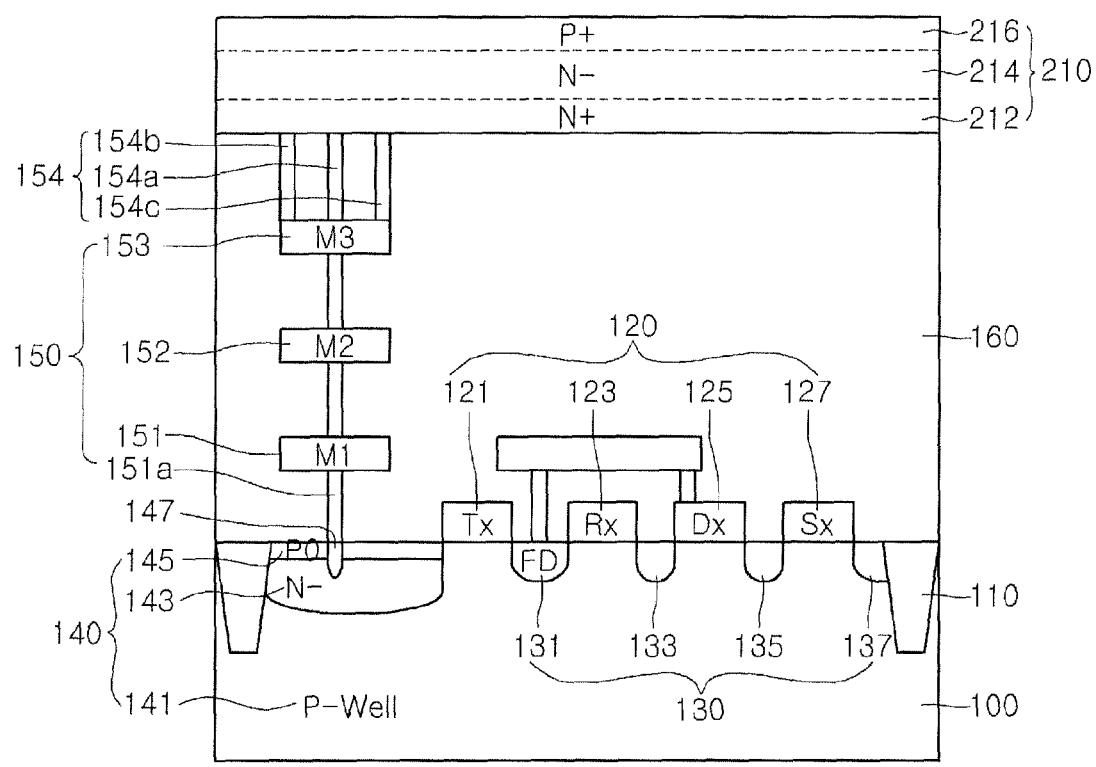
FIG. 1 is a cross-sectional view showing an image sensor according to a first embodiment.

FIG. 1 is a cross-sectional view showing an image sensor according to a first embodiment.

The image sensor according to the first embodiment can include a readout circuitry 120 formed on a first substrate 100, an inter-layer dielectric layer 160 formed on the first substrate 100, a metal line 150 formed in the inter-layer dielectric layer 160 so that the metal line 150 is electrically connected with the readout circuitry 120, a plurality of contact plugs 154 formed on the metal line 150, and an image sensing device 210 formed on the contact plugs 154.

The image sensing device 210 may be a photodiode, but embodiments are not limited thereto. In other words, the image sensing device 210 may be a photogate, or the combination of the photodiode and the photogate. Meanwhile, according to an embodiment, the photodiode is formed on a crystalline semiconductor layer. However, embodiments are not limited thereto. In other words, the photodiode may be formed on an amorphous semiconductor layer.

Reference numerals of FIG. 1, which are not described, will be described below with respect to a method for manufacturing the image sensor.

Hereinafter, a method for manufacturing an image sensor according to the first embodiment will be described with reference to FIGS. 2 to 7.

Figure 2:
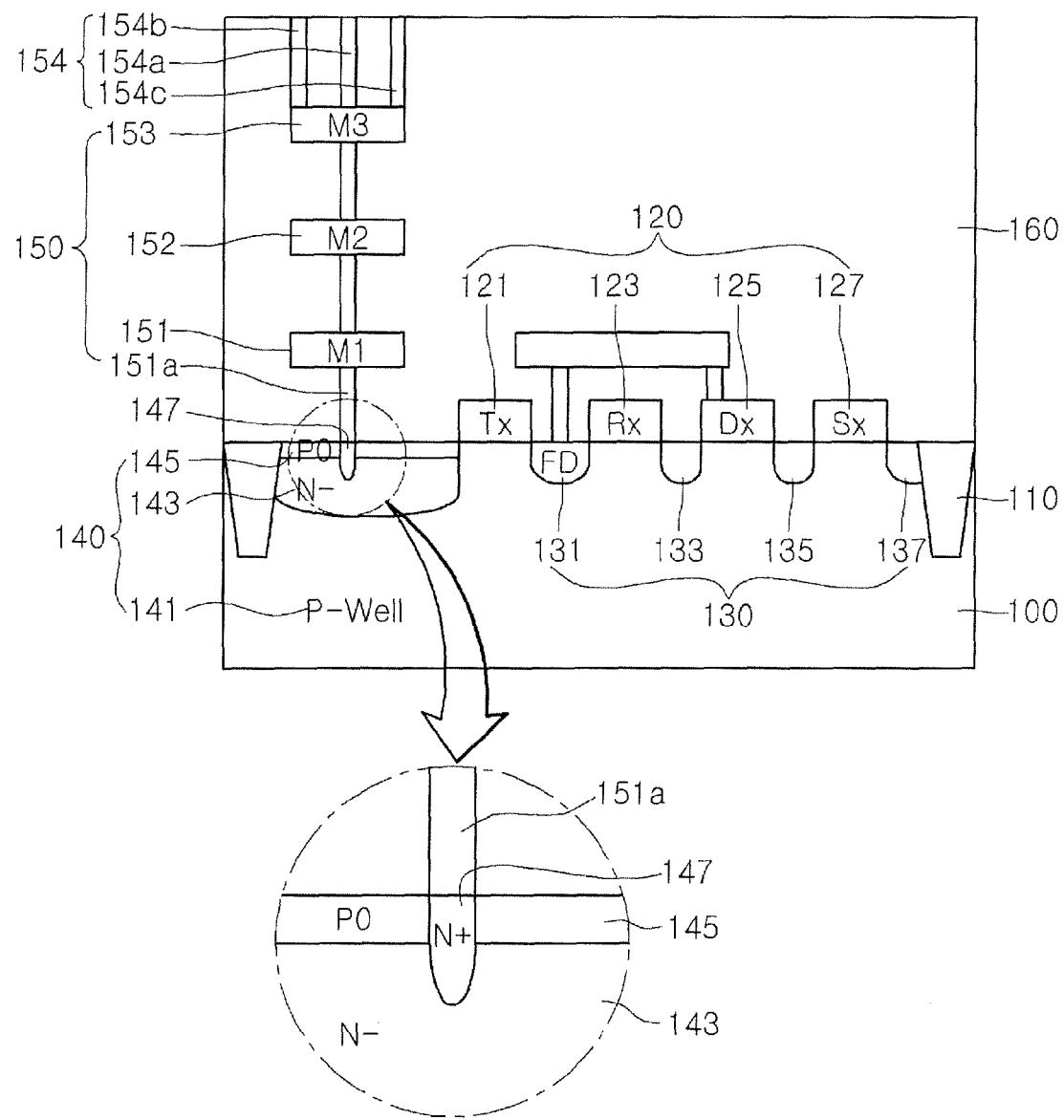
FIGS. 2 to 7 are cross-sectional views showing a method for manufacturing an image sensor according to the first embodiment.

As shown in FIG. 2, the first substrate 100 formed with the metal line 150 and the readout circuitry 120 is prepared. For example, an isolation layer 110 can be formed on the first substrate 100 to define an active area, and the readout circuitry 120 including transistors is formed in the active area. For example, the readout circuitry 120 may include a transfer transistor (Tx) 121, a reset transistor (Rx) 123, a drive transistor (Dx) 125, and a select transistor (Sx) 120. An ion implantation area 130 including a floating diffusion (FD) area 131 and source/drain areas 133, 135, and 137 of the transistors is formed. In addition, according to an embodiment, noise removing circuitry (not shown) may be additionally formed to improve sensitivity.

In a case in which the readout circuitry 120 is formed on the first substrate 100, an electric junction area 140 may be formed on the first substrate 100, and then a first conductive connection area 147 may be formed in the electric junction area 140 such that the electric junction area 140 is electrically connected to the metal line 150.

The electric junction area 140 may be a PN junction area, but embodiments are not limited thereto. For example, the electric junction area 140 may include a second conductive type well 141 (or epitaxial layer), a first conductive type ion implantation layer 143 formed on the second conductive type well 141 (or epitaxial layer), and a second conductive type ion implantation layer 145 formed on the first conductive type ion implantation layer 143. For example, the PN junction area 140 may be a P0 145/N− 143/P− 141 junction area as shown in FIG. 2. Of course, embodiments are not limited thereto. According to certain embodiments, the first substrate 100 can be p-type and/or include the p-type well or epitaxial layer.

According to an embodiment, a device is designed to have potential difference between the source and the drain of the Tx 121, so that the full dumping of photo charges can be achieved. Accordingly, the photo charges generated from the photodiode are dumped into the FD area 131, so that the sensitivity of an output image can be enhanced.

According to an embodiment, as shown in FIG. 2, the electric junction area 140 is formed on the first substrate 100 formed with the readout circuitry 120 to provide a potential difference between the source and the drain of the Tx 121, so that the full dumping of the photo charges can be achieved.

Hereinafter, a dumping structure of the photo charges will be described in detail.

According to this embodiment, different from the FD node 131 having an N+ junction, the P/N/P junction of the electric junction area 140 delivers only a portion of applied voltage and is pinched off at a predetermined voltage. This voltage for the pinch-off is called a pinning voltage, and the pinning voltage depends on the doping concentration of the P0 layer 145 and the N-layer 143.

In detail, electrons generated from the photodiode 210 are moved into the PNP junction area 140. When the Tx 121 is turned on, the electrons are delivered into the FD node 131 so that the electrons are converted into voltage.

Since the maximum voltage of the P0/N−/P− junction area 140 becomes the pinning voltage, and the maximum voltage of the FD node 131 is Vdd minus Vth of Rx 123, electrons generated from the photodiode 210 positioned above a chip can be fully dumped into the FD node 131 without charge sharing due to potential difference between both terminals of the Tx 131.

According to an embodiment, reasons for forming a P0/N−/P-well junction on the Si substrate (the first substrate 100) instead of an N+/P-well junction are as follows. Since positive voltage is applied to the N-layer 143 and ground voltage is applied to the P0 145 and the P-well 141 in the P0/N−/P-well junction during 4-Tr (four transistor) active pixel sensor (APS) reset operation, a P0/N−/P-well double junction structure is pinched off over a predetermined voltage like for a BJT structure. This voltage is called the pinning voltage. Accordingly, a potential difference occurs between both terminals (i.e., source and drain) of Tx 121, so that photo charges are fully dumped into the FD 131 from the N-well through the Tx 121 at an on/off operation of the Tx 121. Accordingly, charge sharing can be inhibited.

Accordingly, different from when the photodiode is simply connected with an N+ junction area according to the conventional technology, saturation and sensitivity may be inhibited from being degraded according to the embodiment.

Referring again to FIG. 2, a first conductive type connection area 147 is formed between the photodiode and the readout circuitry 120 to form a smooth moving path of photo charges, so that a dark current source is minimized, and saturation and sensitivity are prevented from being degraded.

To this end, according to the first embodiment, an N+ doping area can be formed on the surface of the P0/N−/P− junction area 140 as the first conductive type connection area 147 for ohmic contact. The N+ area 147 may make contact with the N− area 143 through the P0 area 145.

In order to inhibit the first conductive type connection area 147 from serving as a leakage source, the width of the first conductive type connection area 147 may be minimized. To this end, according to an embodiment, after etching a via hole for a first metal contact 151a, a plug implantation process can be performed. However, embodiments are not limited thereto. For example, according to another embodiment, after forming an ion implantation pattern (not shown), the first conductive-type connection area 147 may be formed by using the ion implantation pattern as an ion implantation mask.

In other words, when N+ doping is locally performed only in an area for a contact according to the first embodiment, ohmic contact can be smoothly formed while minimizing a dark signal. If N+ doping is performed in the entire source area of the Tx 121 similar to the conventional technology, the dark signal may be increased due to dangling bonds at the surface of the Si-substrate.

Next, an inter-layer dielectric layer 160 and metal line 150 may be formed on the first substrate 100. The metal line 150 may include the first metal contact 151a, a first metal 151, a second metal 152, and a third metal 153, but embodiments are not limited thereto.

Thereafter, according to an embodiment, contact plugs 154 may be formed on the metal line 150. For example, the contact plugs 154 may include first to third contact plugs 154a to 154c on the third metal 153, but embodiments are not limited thereto.

According to an embodiment, the multiple contact plugs 154, which are signal lines contacting the top metal layer of the metal line 150, are formed so that contact resistance can be reduced. To this end, the contact plugs 154 connected to the image sensing device 210 can be formed throughout the pixel area for the image sensing device 210 in numbers as many as possible.

The maximum number of the contact plugs 154 depends on the size of the contact plugs 154 and the interval between the contact plugs. On the assumption that the size of the contact plugs 154 is 'a', the interval between the contact plugs 154 is 'b', and the size of the image sensing part 210 is 'c', the number of the contact plugs 154 along the length of a side of the image sensing part can be c/(a+b) rounded down to a whole number. Therefore, for an image sensing part having a square shape, the number of contact plugs 154 is $[c/(a+b)]^2$ For example, if the size 'c' (e.g., length of a side) of the image sensing part 210 is 2 µm, the size 'a' (e.g., width) of the contact plugs 154 is 0.16 µm, and the interval 'b' (e.g., distance) between the contact plugs is 0.18 µm, the number of contact plugs 154 can be 25. Even if the size 'c' is 1.4 µm, at least 16 contact plugs can be formed and when the size 'c' is 1.2 µm at least 9 contact plugs can be formed.

In the image sensor and the method for manufacturing the same according to embodiments of the present invention, a plurality of the contact plugs 154 for the image sensing device 210 are formed to reduce the resistance of signal lines.

Figure 3:
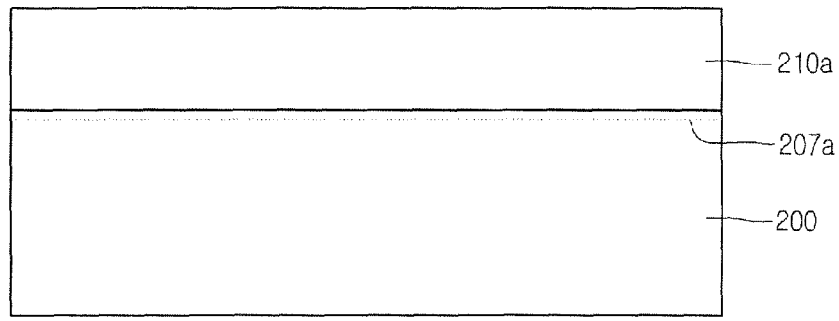

Referring to FIG. 3, a crystalline semiconductor layer 210a can be formed on a second substrate 200. According to the first embodiment, the photodiode 210 is formed on the crystalline semiconductor layer 210a. In accordance with the first embodiment, the image sensing device employs a three-dimensional image sensor located above the readout circuitry 120 to increase a fill factor. In addition, the image sensing device can be formed on the crystalline semiconductor layer 210a, so that defect of the image sensing device 210 can be minimized.

According to an embodiment, the crystalline semiconductor layer 210a is formed on the second substrate 200 through an epitaxial growth process. Thereafter, hydrogen ions are implanted into the boundary between the second substrate 200 and the crystalline semiconductor layer 210a, thereby forming a hydrogen ion implantation layer 207a. In another embodiment, the implantation of the hydrogen ions may be performed after the ion implantation process for the photodiode 210 has been finished.

Figure 4:
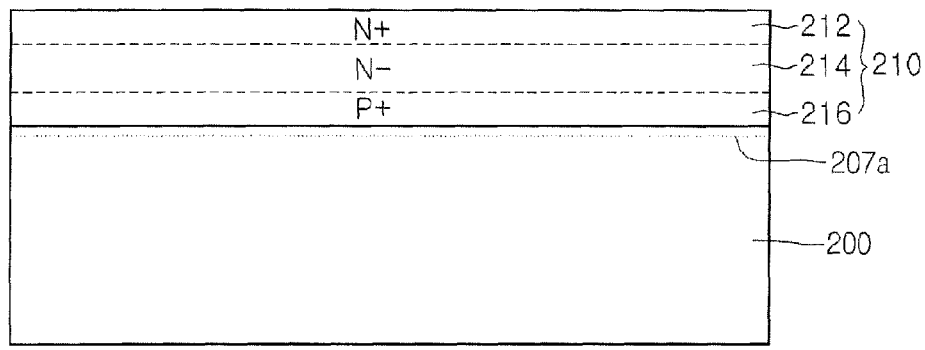

Thereafter, as shown in FIG. 4, the photodiode 210 is formed on the crystalline semiconductor layer 210a through an ion implantation process. For example, a second conductive type conductive layer 216 is formed in a lower portion of the crystalline semiconductor layer 210a. For example, the high-concentration P type conductive layer 216 may be formed by performing an ion implantation process for the entire surface of the second substrate 200 using a blanket implantation process without a mask. For example, the second conductive type conductive layer 216 may have a junction depth of about 0.5 µm or less (from the lower surface of the crystalline semiconductor layer 210a).

Thereafter, a first conductive type conductive layer 214 is formed on the second conductive type conductive layer 216. For example, the first conductive type conductive layer 214 may be a low-concentration N type conductive layer formed by performing an ion implantation process for the entire surface of the second substrate 200 using a blanket implantation process without a mask. For example, the low-concentration first conductive type conductive layer 214 may have a junction depth between about 1.0 µm to about 0.5 µm.

According to the embodiment, the first conductive type conductive layer 214 may be thicker than the second conductive type conductive layer 216, thereby increasing a charge storing capacity. In other words, the N-layer 214 is formed thicker so that the area of the N-layer 214 is expanded. Accordingly, the capacity of containing photo-electrons can be improved.

Thereafter, according to the first embodiment, a high-concentration first conductive type conductive layer 212 may be further formed on the first conductive type conductive layer 214. For example, the high-concentration first conductive type conductive layer 212 may have a junction depth in the range of about 0.05 µm to about 0.2 µm (from the top surface of the crystalline semiconductor layer 210a). For example, an ion implantation process is performed with respect to the entire surface of the second substrate 200 above the first conductive type conductive layer 214 using a blanket implantation process without a mask, thereby further forming the high concentration N+ type conductive layer 212 to contribute to ohmic contact.

Figure 5:
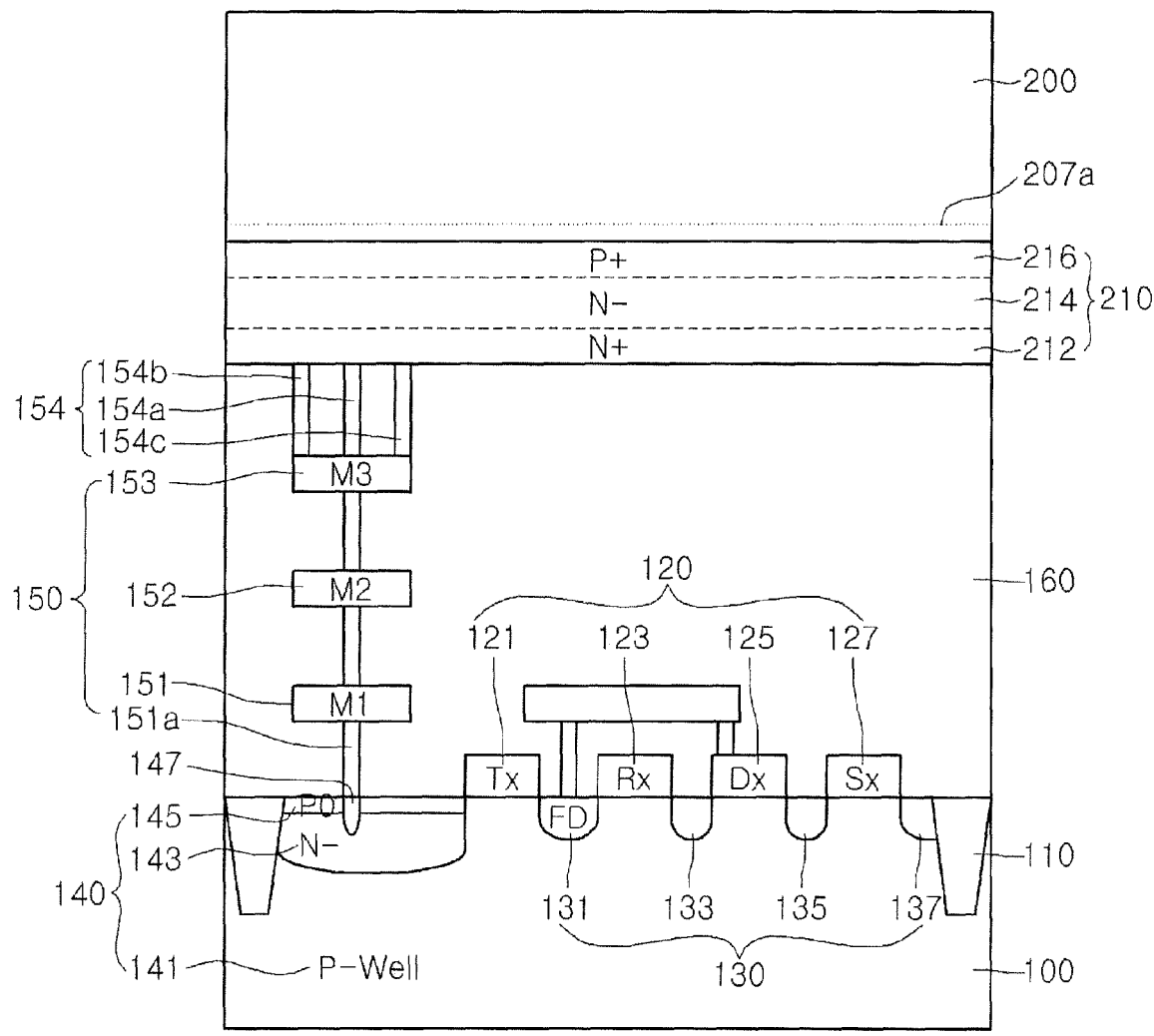

Next, as shown in FIG. 5, the first substrate 100 is bonded to the second substrate 200 such that the photodiode 210 makes contact with the metal line 150. In this case, the first and second substrates 100 and 200 can be bonded to each other after the surficial energy of an interfacial surface between the first and second substrates 100 and 200 is increased through activation using plasma. In addition, in order to improve a bonding strength between the first and second substrates 100 and 200, an insulating layer or a metallic layer can be interposed in the interfacial surface to be bonded.

Figure 6:
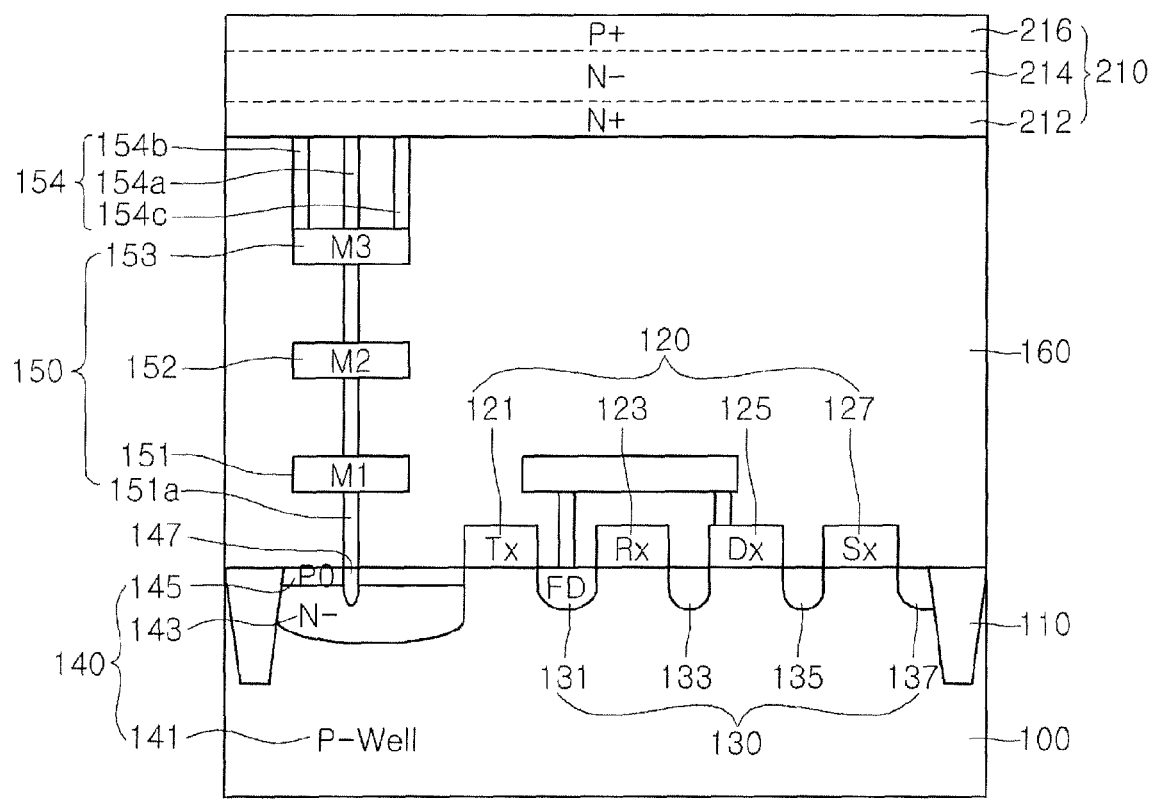

Thereafter, referring to FIG. 6, the hydrogen ion implantation layer 207a can be converted into a hydrogen gas layer through heat treatment for the second substrate 200. Thereafter, on the basis of the hydrogen gas layer, a portion of the second substrate 200 is removed using a blade while the photodiode 210 remains such that the photodiode 210 can be exposed.

Thereafter, the photodiode 210 can be divided according to pixels through, for example, an etching process, and then an insulating layer (not shown) is filled in the etched part between the pixels such that the pixels are separated from each other.

Figure 7:
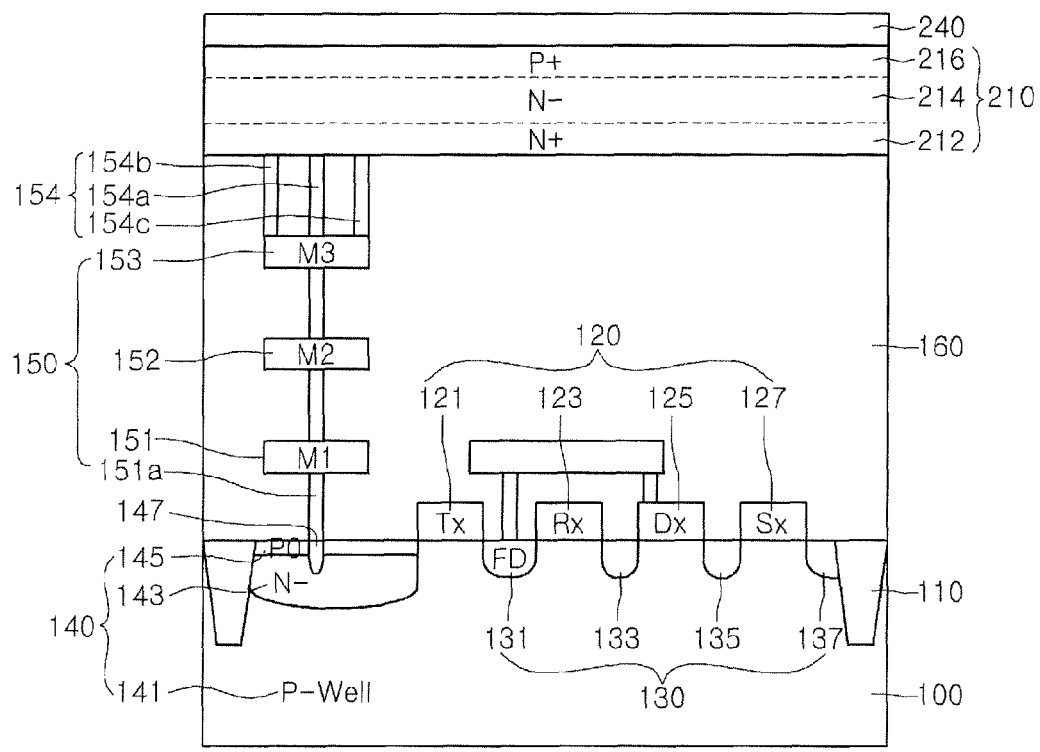

Next, referring to FIG. 7, processes for forming an upper electrode 240 and a color filter (not shown) can be performed.

Second Embodiment

Figure 8:
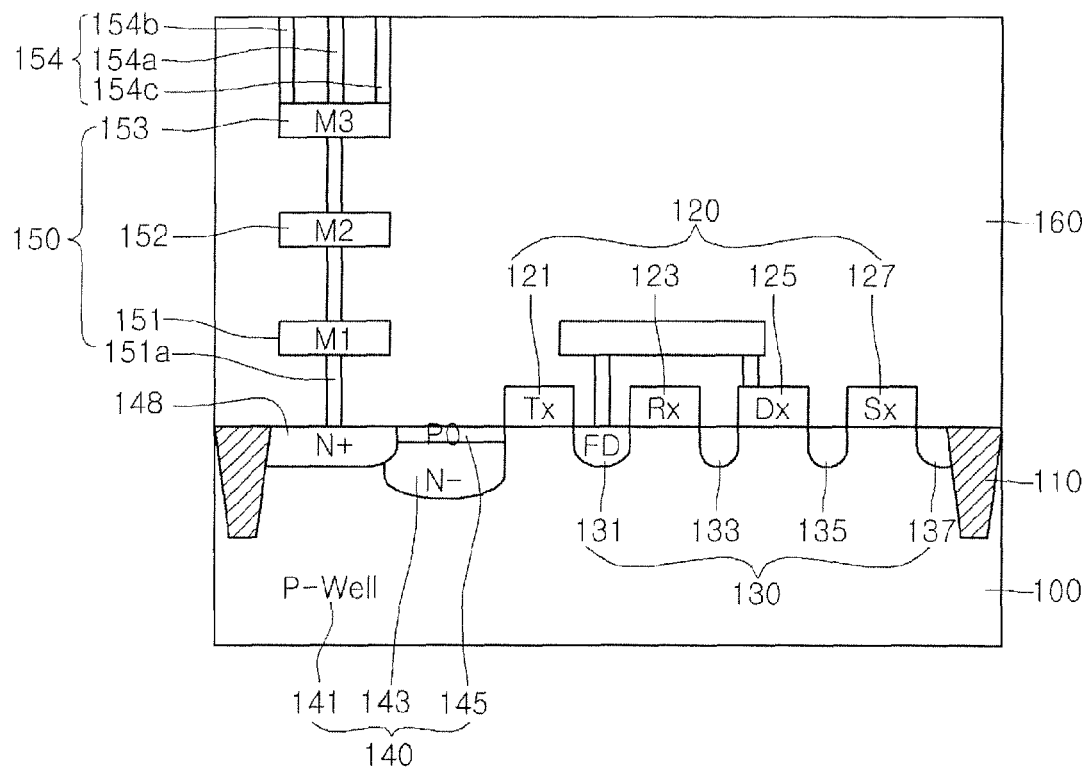
FIG. 8 is a cross-sectional view showing an image sensor according to a second embodiment.

FIG. 8 is a cross-sectional view showing an image sensor according to a second embodiment, and shows the first substrate 100 formed with the metal line 150 in detail.

The second embodiment employs the technical features of the first embodiment.

Different from the first embodiment, the second embodiment incorporates a first conductive type connection area 148 at one side of the electric junction area 140.

According to embodiments of the present invention, an N+ connection area 148 for ohmic contact may be formed in the P0/N–/P– junction area 140. In this case, when the N+ connection area 148 and a first contact plug contact 151a are formed, a leakage source may occur. This is because the device operates in a state in which reverse bias is applied to the P0/N–/P– junction area 140, so that an electric field (EF) occurs on a substrate surface (Si surface). A crystal defect created in a contact forming process becomes a leakage source in the electric field.

In addition, when the N+ connection area 148 is formed on the surface of the P0/N–/P– junction area 140, an electric field may additionally occur due to an N+/P0 junction. This electric field may make a leakage source.

Accordingly, the second embodiment suggests a layout in which the first contact plug 151a is electrically connected with the N− junction 143 through an active area including the N+ connection area 148 that is not created by doping ions into a central region of the P0 area 145.

According to the second embodiment, an electric field is not generated on the Si surface, so that dark current of a 3-D integrated CIS can be reduced.

The disclosure is not limited to the embodiments and accompanying drawings, but various variations and modifications are possible within the scope of the following claims.

In the image sensor and the method for manufacturing the same according to embodiments, a plurality of contact plugs are formed with respect to each image sensing device, so that resistance of signal lines can be reduced.

According to embodiments, a device is designed such that potential difference exits between the source and the drain terminals of the Tx, thereby achieving the full dumping of photo charges.

In addition, according to embodiments, a charge connection area is formed between the photodiode and the readout circuitry to form a smooth moving path of photo charges, so that a dark current source is minimized, and saturation and sensitivity are inhibited from being degraded.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor comprising:
   a readout circuitry formed on a first substrate;
   an inter-layer dielectric layer formed on the first substrate;
   a metal line formed in the inter-layer dielectric layer such that the metal line is electrically connected with the readout circuitry;
   a plurality of contact plugs formed on the metal line;
   an image sensing device formed on the plurality of contact plugs, wherein the image sensing device is electrically connected to the metal line through the plurality of contact plugs; and
   an electric junction area formed on the first substrate such that the electric junction area is electrically connected with the readout circuitry and electrically connects the metal line to the readout circuitry;
   wherein the readout circuitry comprises a transistor,
   wherein a potential difference is made between a source and a drain of the transistor, the electric junction area being at the source of the transistor,
   wherein the transistor is a transfer transistor, and
   wherein the potential difference is made by an ion implantation concentration of the source of the transistor being lower than ion implantation concentration of a floating diffusion area at the drain of the transistor.

2. The image sensor of claim 1, wherein the electric junction area comprises:
   a first conductive type ion implantation area formed on the first substrate; and
   a second conductive type ion implantation area formed on the first conductive type ion implantation area.

3. The image sensor of claim 1, further comprising a first conductive type connection area formed between the electric junction area and the metal line.

4. The image sensor of claim 3, wherein the first conductive type connection area is on the electric junction area and electrically connects the metal line to the electric junction area.

5. The image sensor of claim 3, wherein the first conductive type connection area is at one side of the electric junction area and electrically connects the metal line to the electric junction area.

6. A method for manufacturing an image sensor, the method comprising:
   forming a readout circuitry on a first substrate;
   forming an inter-layer dielectric layer on the first substrate, and forming a metal line in the inter-layer dielectric layer such that the metal line is electrically connected with the readout circuitry;
   forming a plurality of contact plugs on the metal line per unit pixel;
   forming an image sensing device on the plurality of contact plugs; and
   forming an electric junction area on the first substrate such that the electric junction area is electrically connected with the readout circuitry and electrically connects the metal line to the readout circuitry;
   wherein the readout circuitry comprises a transistor,
   wherein a potential difference is made between a source and a drain of the transistor, the electric junction area being formed at the source of the transistor,
   wherein the transistor is a transfer transistor, and
   wherein the potential difference is made by forming and ion implantation concentration of the source of the transistor lower than ion implantation concentration of a floating diffusion area at the drain of the transistor.

7. The method of claim 6, wherein the forming of the electric junction area comprises:
   forming a first conductive type ion implantation area on the first substrate; and
   forming a second conductive type ion implantation area on the first conductive type ion implantation area.

8. The method of claim 6, further comprising forming a first conductive type connection area between the electric junction area and the metal line to electrically connect the metal line to the electric junction area.

9. The method of claim 8, wherein the first conductive type connection area is formed on the electric junction area.

10. The method of claim 8, wherein the first conductive type connection area is formed at one side of the electric junction area.

* * * * *